United States Patent
Ching et al.

(10) Patent No.: US 9,299,810 B2
(45) Date of Patent: Mar. 29, 2016

(54) FIN-TYPE FIELD EFFECT TRANSISTOR AND METHOD OF FABRICATING THE SAME

(71) Applicant: Taiwan Semiconductor Manufacturing Company Limited, Hsin-Chu (TW)

(72) Inventors: Kuo-Cheng Ching, Zhubei (TW); Chih-Hao Wang, Baoshan Township (TW); Zhiqiang Wu, Chubei (TW); Carlos H. Diaz, Mountain View, CA (US); Jean-Pierre Colinge, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 149 days.

(21) Appl. No.: 13/935,797

(22) Filed: Jul. 5, 2013

(65) Prior Publication Data

US 2015/0008489 A1    Jan. 8, 2015

(51) Int. Cl.
*H01L 29/76* (2006.01)
*H01L 29/66* (2006.01)
*H01L 29/78* (2006.01)
*H01L 21/8234* (2006.01)
*H01L 21/8238* (2006.01)
(Continued)

(52) U.S. Cl.
CPC .. *H01L 29/66795* (2013.01); *H01L 21/823431* (2013.01); *H01L 21/823821* (2013.01); *H01L 21/845* (2013.01); *H01L 27/1211* (2013.01); *H01L 29/1054* (2013.01); *H01L 29/785* (2013.01)

(58) Field of Classification Search
CPC .............. H01L 21/823431; H01L 21/823821; H01L 21/845; H01L 29/66795; H01L 29/785; H01L 29/1054; H01L 27/1211

USPC .......................................................... 257/288
See application file for complete search history.

(56) References Cited

U.S. PATENT DOCUMENTS

2009/0278196 A1 * 11/2009 Chang et al. .................. 257/328
2010/0059807 A1    3/2010 Cho et al.
(Continued)

FOREIGN PATENT DOCUMENTS

| JP | 2012160730 | 8/2012 |
| KR | 10-2010-0028910 | 3/2010 |
| KR | 10-2013-0018174 | 2/2013 |

OTHER PUBLICATIONS

Korean Office Action dated Nov. 26, 2014, 8 pages.
(Continued)

*Primary Examiner* — Matthew Gordon
(74) *Attorney, Agent, or Firm* — Cooper Legal Group, LLC

(57) ABSTRACT

A fin-type field effect transistor includes a first fin including a first source, a first drain, and a first channel. The fin-type field effect transistor includes a second fin including a second source, a second drain, and a second channel. The fin-type field effect transistor includes a first semiconductor region under the first fin and a second semiconductor region under the second fin. A first reacted region is adjacent the first semiconductor region while a second reacted region is adjacent the second semiconductor region. The first reacted region has a first dimension causing a first strain in the first channel. The second reacted region has a second dimension causing a second strain in the second channel. The first strain and second strain are substantially equal to one another. A method of fabricating an example fin-type field effect transistor is provided.

20 Claims, 13 Drawing Sheets

(51) Int. Cl.
*H01L 21/84* (2006.01)
*H01L 27/12* (2006.01)
*H01L 29/10* (2006.01)

(56) References Cited

U.S. PATENT DOCUMENTS

2012/0070953 A1* 3/2012 Yu et al. .................. 438/301
2012/0193751 A1 8/2012 Kawasaki et al.
2014/0124863 A1* 5/2014 Cheng et al. .................. 257/350
2014/0203334 A1 7/2014 Colinge et al.
2014/0369372 A1 12/2014 Clifton et al.

OTHER PUBLICATIONS

Corresponding Korean Notice of Allowance dated Jun. 8, 2015, 3 pages.

* cited by examiner

FIN-TYPE FIELD EFFECT TRANSISTOR AND METHOD OF FABRICATING THE SAME

BACKGROUND

A fin-type field effect transistor is a type of semiconductor device in which current flows between a source region and a drain region of the device, through a channel region of the device, upon application of a voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more techniques, and resulting structures, for fabricating a fin-type field effect transistor are provided herein.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
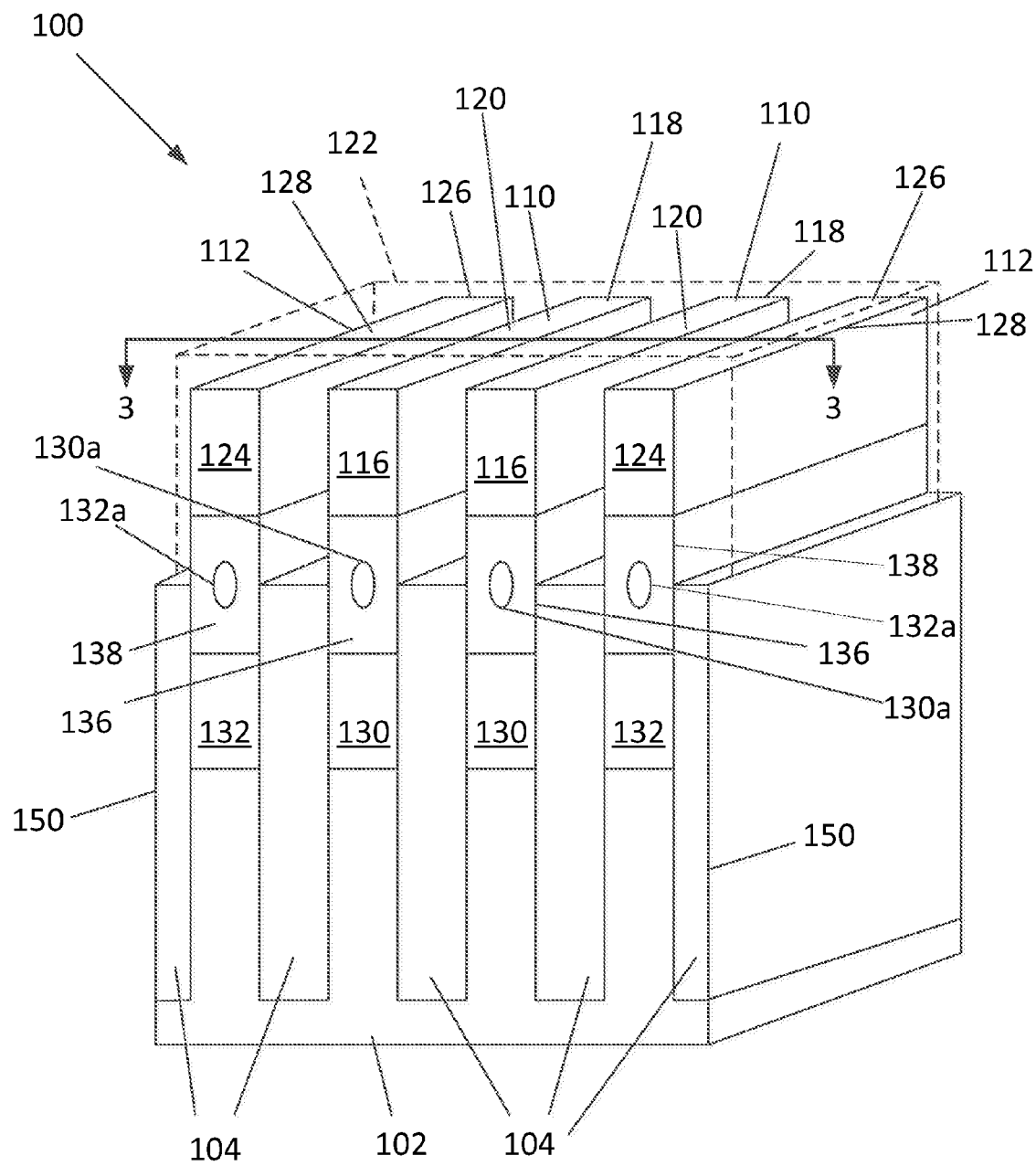
FIG. 1 illustrates a portion of a fin-type field effect transistor, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 is a perspective view illustrating a fin-type field effect transistor 100 according to some embodiments. In an embodiment, the fin-type field effect transistor 100 is formed upon a substrate 102. The substrate 102 comprises any number of materials, alone or in combination. According to some embodiments, the substrate 102 comprises silicon, an epitaxial layer, a silicon-on-insulator (SOI) structure, etc. According to some embodiments, the substrate corresponds to a wafer or a die formed from a wafer.

In an embodiment, portions of the fin-type field effect transistor 100 are surrounded by or comprised within a shallow trench isolation (STI) region 104. The STI region 104 electrically isolates various regions and, in an embodiment, isolates fins from other fins. The STI region 104 is formed in any number of ways, such as by deposition, for example. In an embodiment, the STI region 104 is formed on the substrate 102 and comprises one or more insulator or dielectric materials, alone or in combination, such as silicon oxide, silicon dioxide, silicon nitride, silicon oxynitride, other suitable materials, etc.

According to some embodiments, the fin-type field effect transistor 100 includes one or more fins, such as, first fins 110 and second fins 112. In an embodiment, the first fins 110 comprise innermost fins and are positioned between the second fins 112. In an embodiment, the second fins 112 are positioned near outer edges 150 of the fin-type field effect transistor 100.

In an embodiment, the first fins 110 comprise a first source 116 at one end, a first drain 118 at an opposing second end, and a first channel 120 located between the first source 116 and the first drain 118. According to some embodiments, a gate 122 at least partially wraps around the first channel 120. In some embodiments, the first channel 120 comprises a long channel. In some embodiments, the first channel 120 comprises a short channel.

According to some embodiments, the second fins 112 include a second source 124 at one end, a second drain 126 at an opposing second end, and a second channel 128 located between the second source 124 and the second drain 126. According to an embodiment, the gate 122 at least partially wraps around the second channel 128. In some embodiments, the second fins 112 are substantially identical to the first fins 110. In some embodiments, the second channel 128 comprises a long channel. In some embodiments, the second channel 128 comprises a short channel.

According to some embodiments, the fin-type field effect transistor 100 comprises a first semiconductor region 130 under the first fins 110. In some embodiments, the fin-type field effect transistor 100 comprises a second semiconductor region 132 under the second fins 112. In some embodiments, the first semiconductor region 130 and second semiconductor region 132 are separated by the STI region 104. In an embodiment, the first semiconductor region 130 and second semiconductor region 132 comprise silicon germanium (SiGe), etc. In some embodiments, the composition of the first semiconductor region 130 and second semiconductor region 132 is selected to facilitate oxidation and swelling. According to some embodiments, the first semiconductor region 130 and second semiconductor region 132 react with a gas or fluid, which causes the first semiconductor region 130 and second semiconductor region 132 to change into an oxidation state. In an embodiment, this changed oxidation state of the first semiconductor region 130 and second semiconductor region 132 produces swelling.

In some embodiments, the fin-type field effect transistor 100 includes a first reacted region 136 located adjacent the first semiconductor region 130 under the first fins 110. In an embodiment, the first reacted region 136 is in contact with the first semiconductor region 130. In some embodiments, the fin-type field effect transistor 100 includes a second reacted region 138 located adjacent the second semiconductor region 132 under the second fins 112. In an embodiment, the second reacted region 138 is in contact with the second semiconductor region 132.

In some embodiments, the first reacted region 136 comprises a material that has undergone a chemical reaction. In some embodiments, the second reacted region 138 comprises a material that has undergone a chemical reaction. According to some embodiments, this chemical reaction comprises oxidation of the first semiconductor region 130 and second semiconductor region 132, which causes expansion of the first reacted region 136 and second reacted region 138. In an embodiment, the first reacted region 136 comprises a first oxidized region formed from the first semiconductor region 130. In an embodiment, the second reacted region 138 comprises a second oxidized region formed from the second semiconductor region 132.

In some embodiments, the first semiconductor region 130 and second semiconductor region 132 comprise silicon germanium (SiGe). According to some embodiments, during oxidation, at least one of the first semiconductor region 130 or second semiconductor region 132 are exposed to oxygen. In some embodiments, the first semiconductor region 130 reacts with the oxygen such that the first semiconductor region 130 is at least partially converted to form the first reacted region 136. In some embodiments, the first reacted region 136 comprises silicon germanium oxide (SiGeOx). In some embodiments, the second semiconductor region 132 reacts with the oxygen such that the second semiconductor region 132 is at least partially converted to form the second reacted region 138. In some embodiments, the second reacted region 138 comprises silicon germanium oxide (SiGeOx).

According to some embodiments, a tensile strain is induced in the first channel 120 and second channel 128 due to expansion of the first reacted region 136 and second reacted region 138, respectively. In an embodiment, a first unreacted portion 130a of the first semiconductor region 130 is not oxidized and will not form the first reacted region 136. In some embodiments, a second unreacted portion 132a of the second semiconductor region 132 is not oxidized and will not form the second reacted region 138.

Figure 2A:
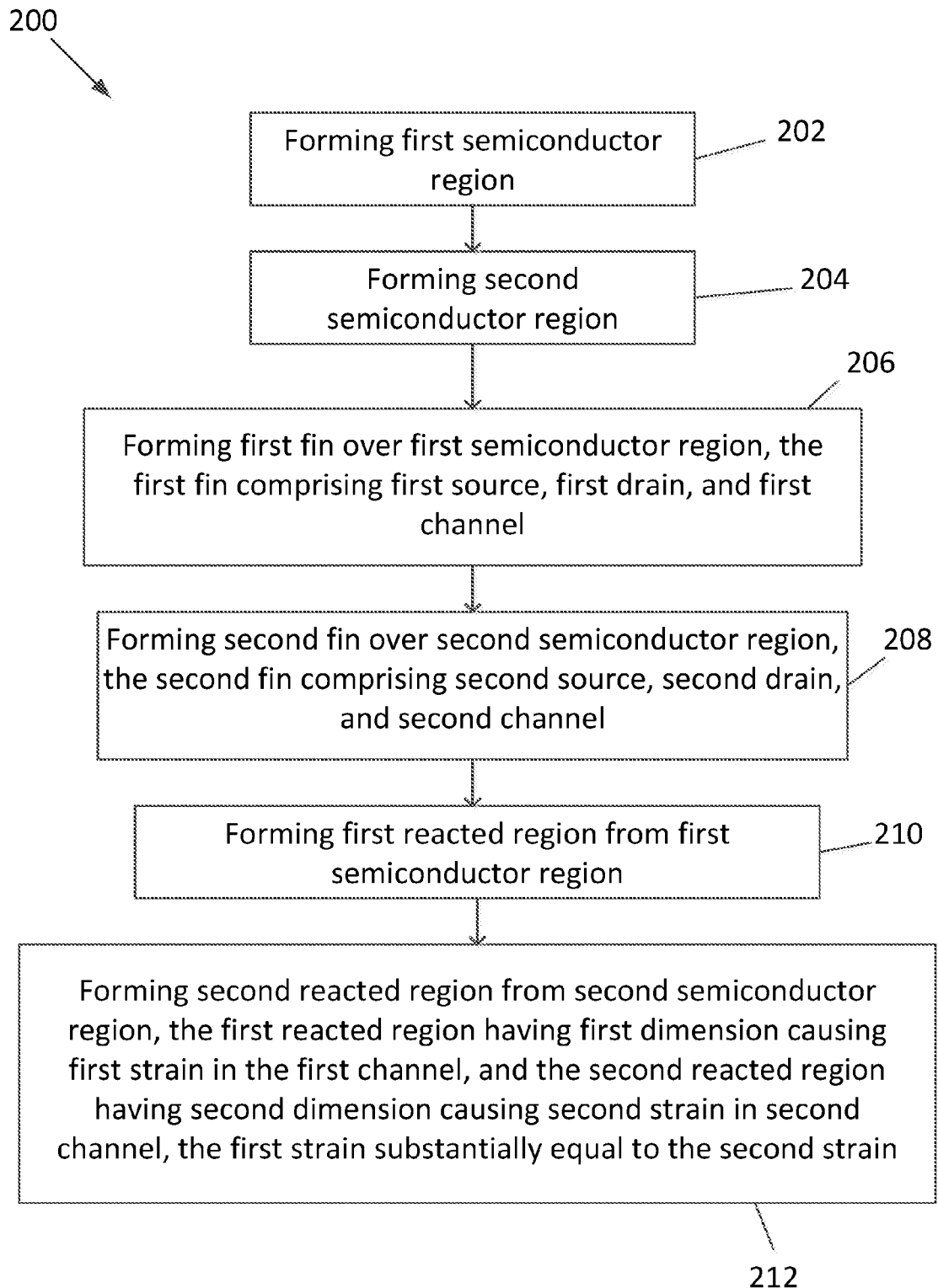
FIG. 2a illustrates a method of fabricating a fin-type field effect transistor, according to an embodiment.

Turning to FIG. 2a, in an embodiment, a method 200 of fabricating a fin-type field effect transistor, such as at least one of 100, 700, or 900, is illustrated. In an embodiment, at 202, the method 200 comprises forming a first semiconductor region, such as 130. In an embodiment, at 204, the method 200 comprises forming a second semiconductor region, such as 132. In an embodiment, at 206, the method 200 comprises forming a first fin, such as 110, over the first semiconductor region, the first fin comprising a first source, a first drain, and a first channel, such as 116, 118 and 120. In an embodiment, at 208, the method 200 comprises forming a second fin, such as 112, over the second semiconductor region, the second fin comprising a second source, a second drain, and a second channel, such as 124, 126 and 128. In an embodiment, at 210, the method 200 comprises forming a first reacted region, such as 136, from the first semiconductor region. In an embodiment, at 212, the method 200 comprises forming a second reacted region, such as 138, from the second semiconductor region, the first reacted region having a first dimension causing a first strain in the first channel, and the second reacted region having a second dimension causing a second strain in the second channel, the first strain substantially equal to the second strain.

Figure 2B:
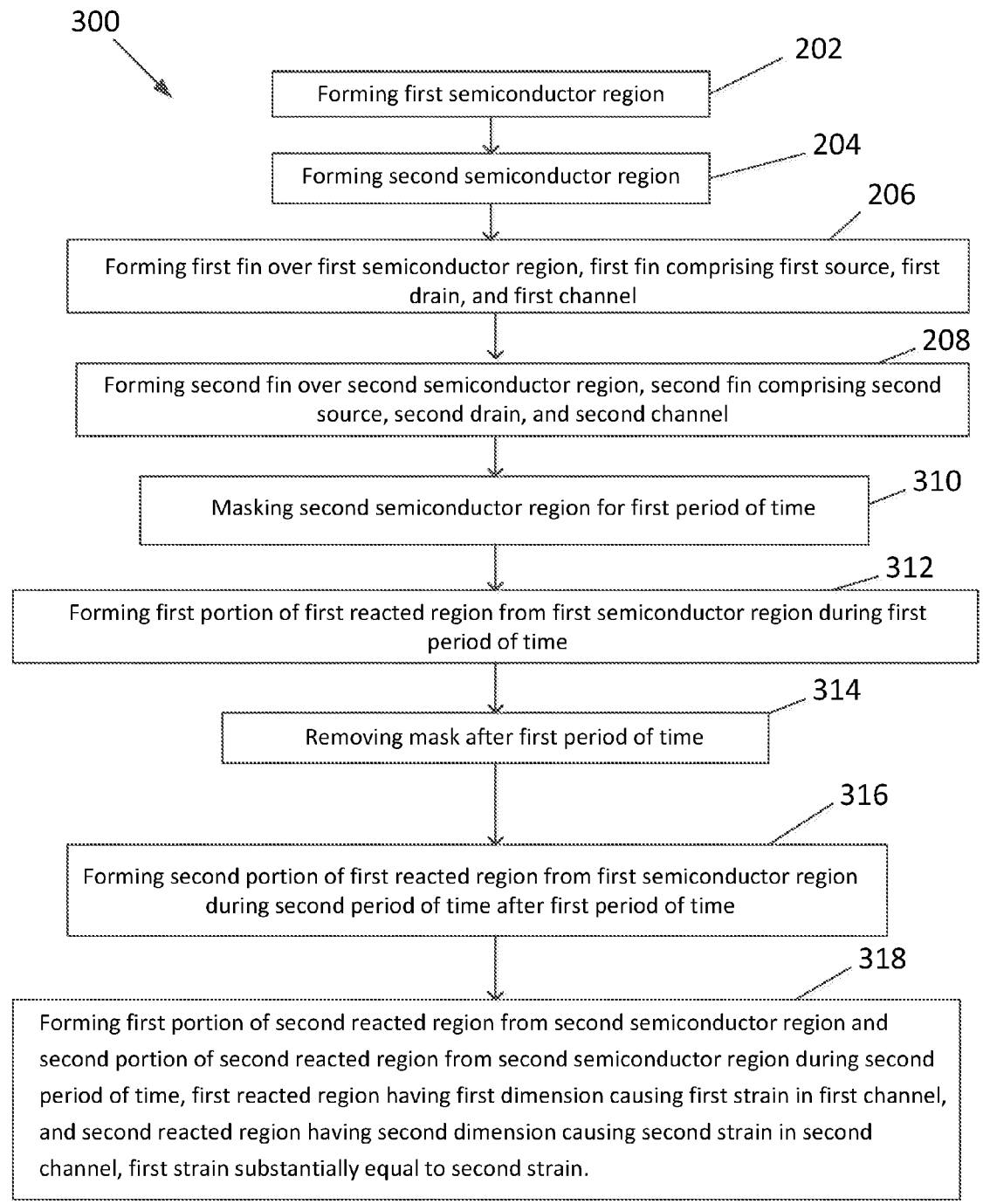
FIG. 2b illustrates a method of fabricating a fin-type field effect transistor, according to an embodiment.

Turning to FIG. 2b, in an embodiment, a second example method 300 of fabricating a fin-type field effect transistor, such as at least one of 100, 700, or 900, is illustrated. In an embodiment, the method 300 comprises 202, 204, 206, and 208. In an embodiment, at 310, the method 300 comprises masking the second semiconductor region, such as 132, for a first period of time. In an embodiment, at 312, the method 300 comprises forming a first portion, such as 502, of the first reacted region, such as 136, from the first semiconductor region, such as 130, during the first period of time. In an embodiment, at 314, the method 300 comprises removing the mask, such as 350, after the first period of time. In an embodiment, at 316, the method 300 comprises forming a second portion, such as 514, of the first reacted region, such as 136, from the first semiconductor region, such as 130, during a second period of time after the first period of time. In an embodiment, at 318, the method 300 comprises forming a first portion, such as 502, of a second reacted region, such as 138, from the second semiconductor region and a second portion, such as 514, of the second reacted region from the second semiconductor region during the second period of time, the first reacted region, such as 136, having a first dimension, such as 608, causing a first strain, such as 610, in the first channel, and the second reacted region having a second dimension, such as 602, causing a second strain, such as 604, in the second channel, the first strain substantially equal to the second strain.

Figure 3:
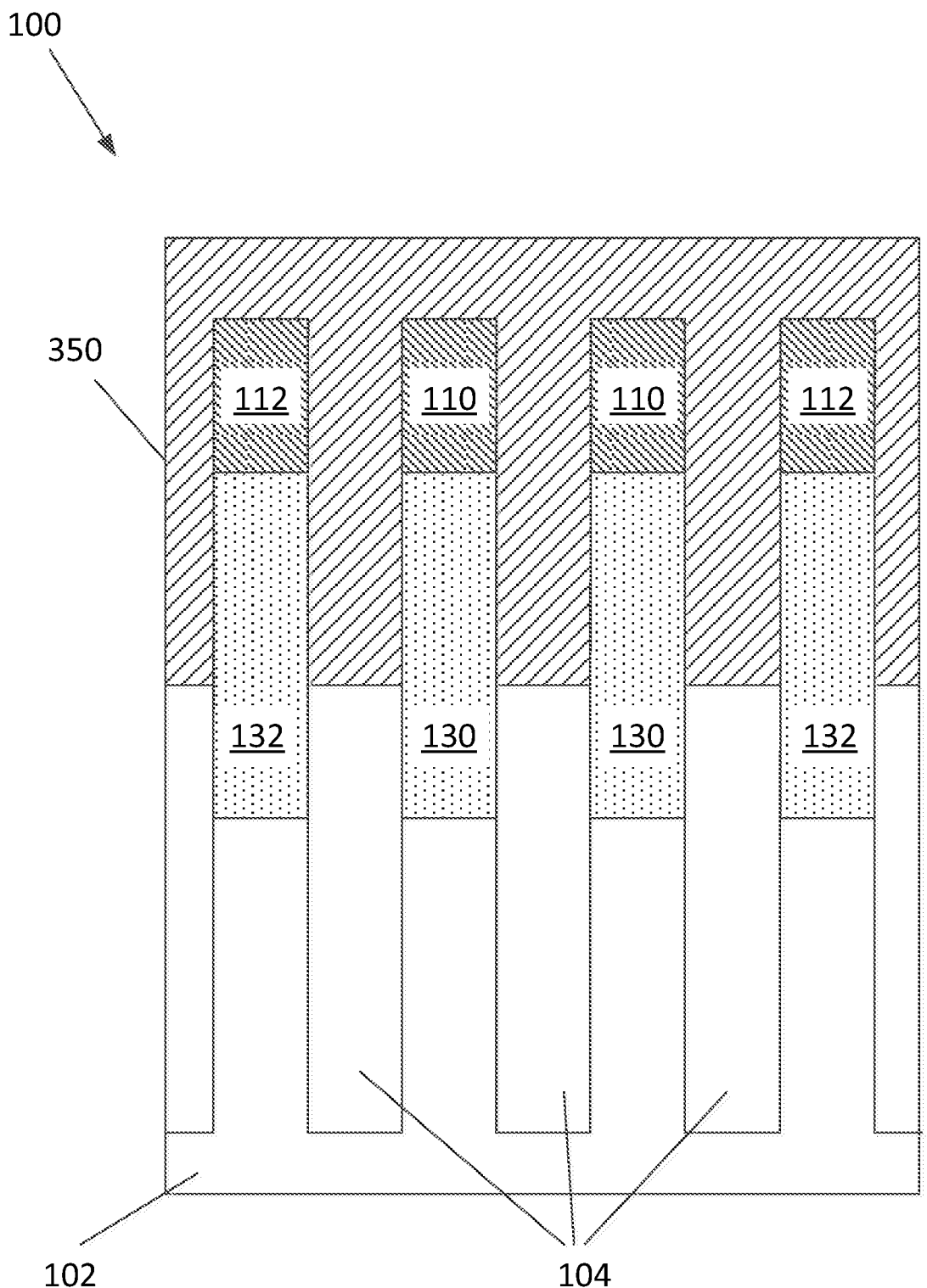
FIG. 3 illustrates masking associated with forming a fin-type field effect transistor, according to an embodiment.

FIGS. 3-12 are cross-sectional views illustrating the embodiment of FIG. 1 taken along line 3-3 at various stages fabrication. Portions of methods 100 and 200 are described with reference to FIGS. 3-12. Turning to FIG. 3, at 202 and 204, the methods 200, 300 include forming the first semiconductor region 130 and forming the second semiconductor region 132. In an embodiment, the first semiconductor regions 130 and second semiconductor regions 132 are formed by forming one or more openings within the substrate 102, such as by etching. In an embodiment, a semiconductor material of which the first semiconductor region 130 and second semiconductor region 132 are comprised is formed within the openings, such as by deposition, epitaxial growth, etc. In some embodiments, the semiconductor material includes germanium (Ge), silicon (Si), gallium arsenide (GaAs), aluminum gallium arsenide (AlGaAs), silicon germanium (SiGe), gallium arsenide phosphide (GaAsP), etc., alone or in combination.

At 206, the methods 200, 300 include forming the first fin 110 over the first semiconductor region 130, with the first fin 110 comprising the first source 116, the first drain 118, and the first channel 120. At 208, the methods 200, 300 include forming the second fin 112 over the second semiconductor region 132, with the second fin 112 comprising the second source 124, the second drain 126, and the second channel 128. In some embodiments, the first fin 110 and second fin 112 are formed by deposition.

According to some embodiments, a mask 350 is formed over the substrate 102, the STI region 104, the first fins 110, and the second fins 112. The mask 350 includes any number of materials, including, nitride, silicon oxide, silicon nitride, silicon oxynitride, etc., alone or in combination. According to some embodiments, the mask 350 is formed by deposition.

Figure 4:
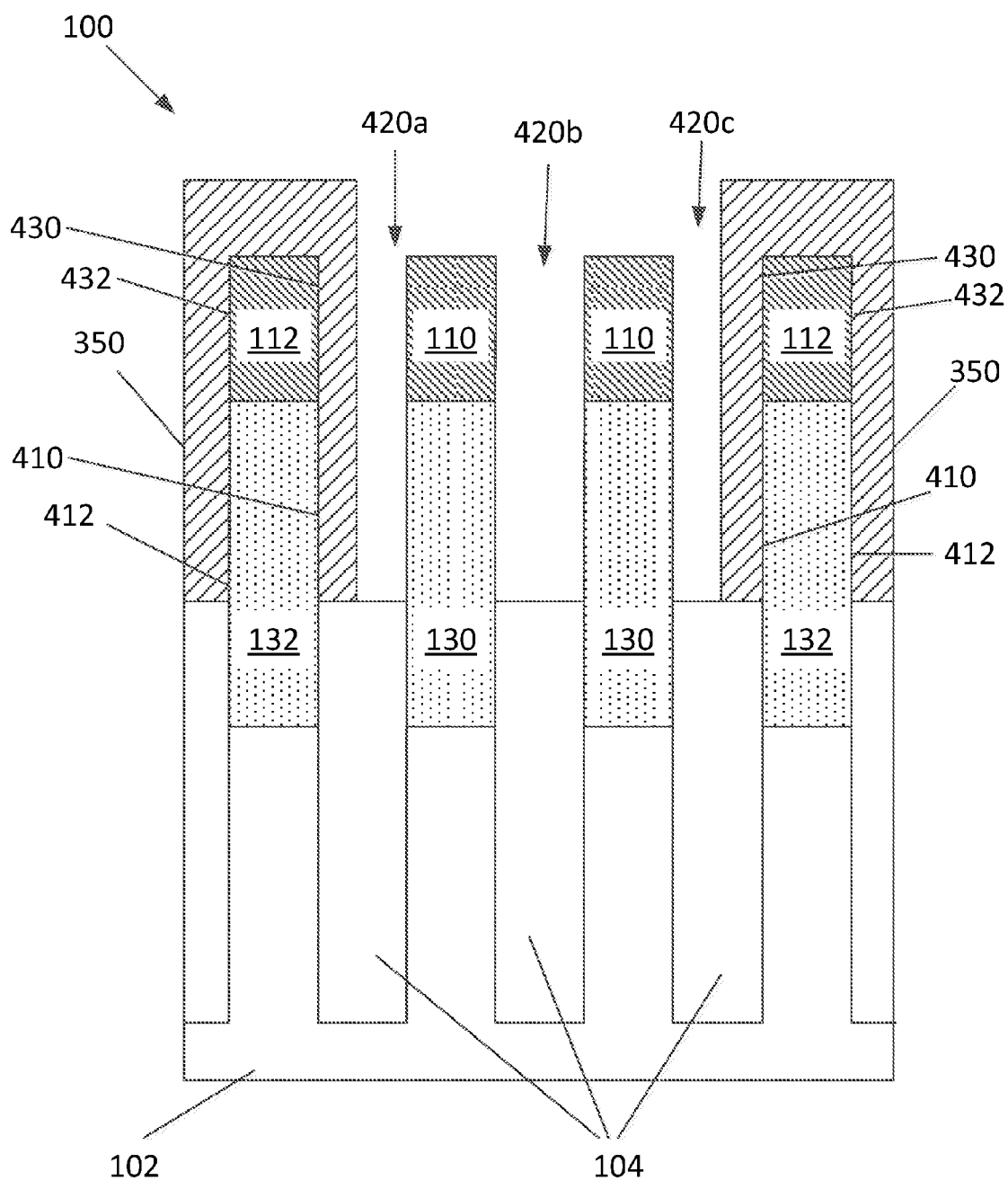
FIG. 4 illustrates forming an opening associated with forming a fin-type field effect transistor, according to an embodiment.
Figure 5:
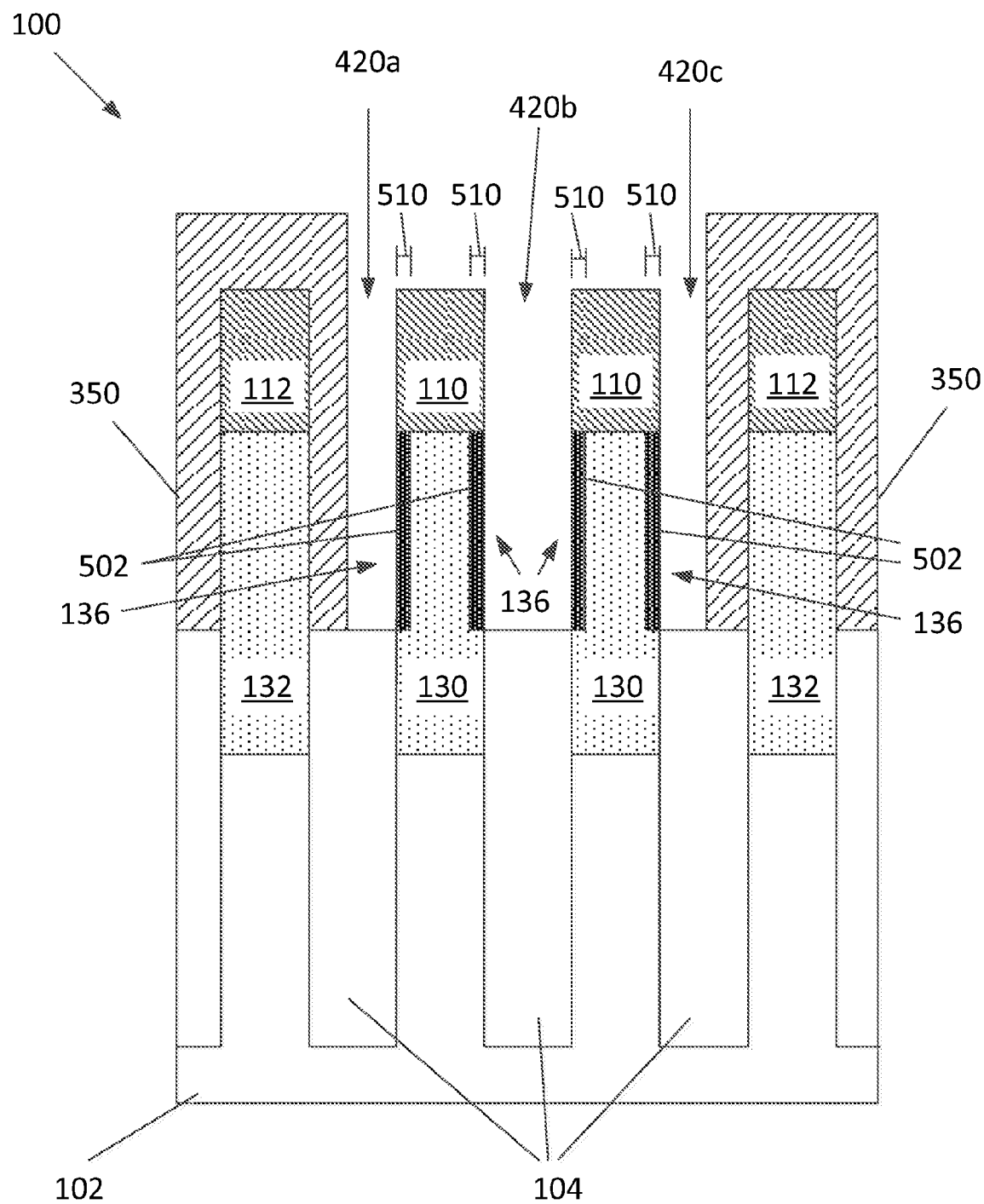
FIG. 5 illustrates forming a reacted region associated with forming a fin-type field effect transistor, according to an embodiment.

Turning now to FIG. 4, in an embodiment, at 310, the method 300 includes masking the second semiconductor region 132 for a first period of time. In some embodiments, a portion of the mask 350 is removed, such as by etching, to expose the first fins 110 and first semiconductor regions 130 and thereby form a first opening 420a, second opening 420b, and third opening 420c. In an embodiment, the mask 350 masks a first side 410 of the second semiconductor region 132 and a first side 430 of the second fins 112. In an embodiment, the first side 410 comprises an inner side of the second semiconductor region 132 and faces the first semiconductor region 130. In an embodiment, the first side 430 comprises an inner side of the second fins 112 and faces the first fins 110. In an embodiment, the mask 350 masks a second side 412 of the second semiconductor region 132 and a second side 432 of the second fins 112. In an embodiment, the second side 412 comprises an outer side of the second semiconductor region 132 and faces away from the first semiconductor region 130. In an embodiment, the second side 432 comprises an outer side of the second fins 112 and faces away from the first fins 110. Turning to FIG. 5, at 210, the method 200 includes forming the first reacted region 136 from the first semiconductor region 130. At 312, the method 300 includes forming a first portion 502 of the first reacted region 136 from the first semiconductor region 130 during the first period of time. In an embodiment, the first semiconductor region 130 is exposed to oxygen through the first opening 420a, second opening 420b, and third opening 420c to form the first portion 502 of the first reacted region 136 during the first period of time, during which the second semiconductor region 132 remains masked by the mask 350 and thus remains substantially unaffected by the oxygen. In an embodiment, the first period of time is between about five to twenty minutes.

According to some embodiments, during the first period of time, an oxidation process occurs at the first semiconductor regions 130. In an embodiment, the oxidation process is conducted in an oxygen ambient atmosphere. In an embodiment, during the oxidation process, the first reacted region 136, having an initial dimension 510, is formed from the first semiconductor region 130. In some embodiments, given that the first reacted region 136 is formed from the first semiconductor region 130, at least some of the first reacted region 136 extends at least partially into the first semiconductor region 130. In an embodiment, the first semiconductor region 130 comprises silicon germanium (SiGe) while the first reacted region 136 comprises silicon germanium oxide (SiGeOx).

Figure 6:
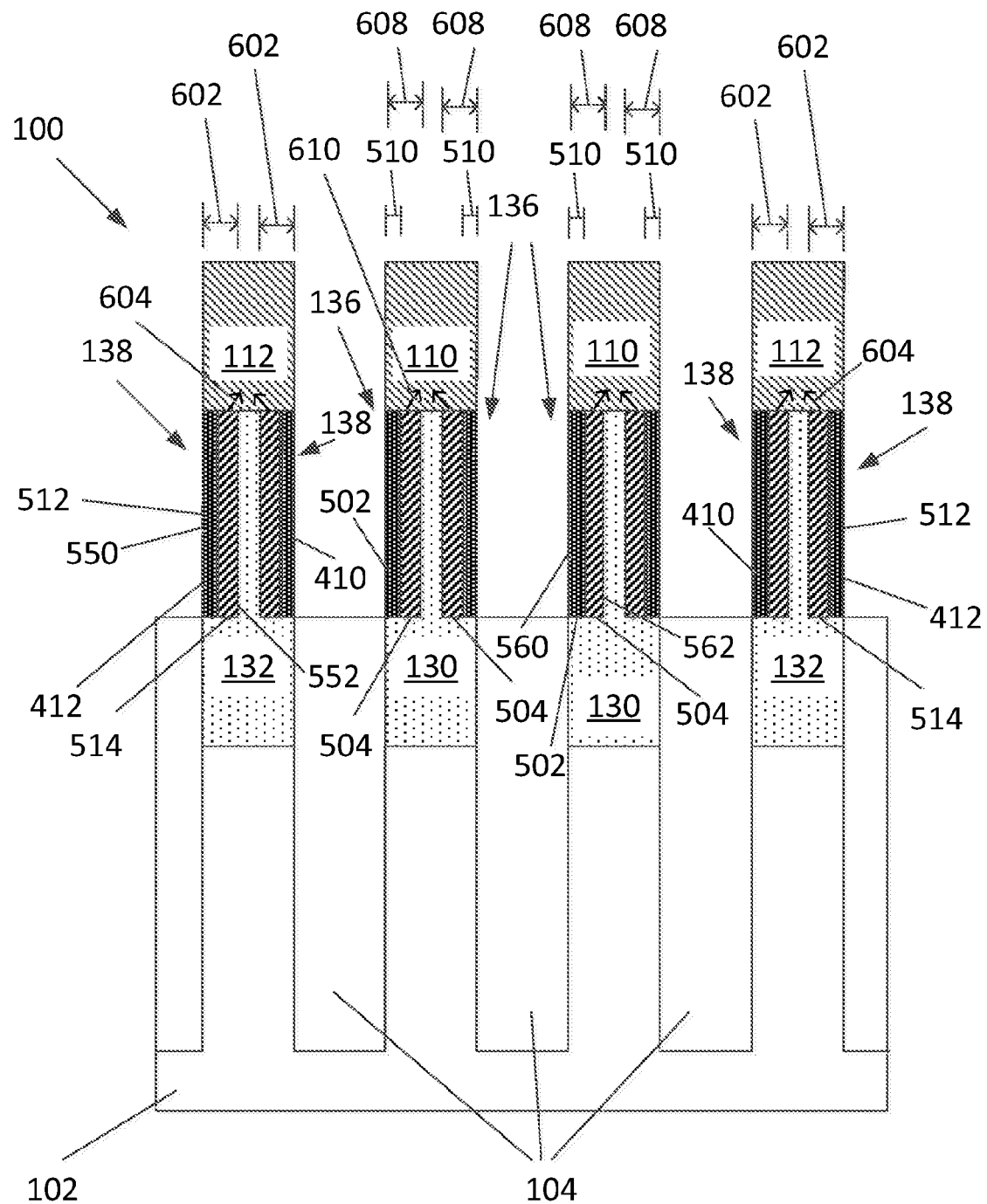
FIG. 6 illustrates forming a reacted region associated with forming a fin-type field effect transistor, according to an embodiment.

Turning to FIG. 6, at 314, the method 300 includes removing the mask 350 after the first period of time. In an embodiment, the mask 350 is removed from the second semiconductor region 132 after the first period of time, such as by etching, acid washing, etc. In some embodiments, the removing comprises removing the mask 350 from the first side 410 and the second side 412 of the second semiconductor region 132, such that the second semiconductor region 132 is exposed to oxygen.

At 212, in an embodiment, the method 200 includes forming the second reacted region 138 from the second semiconductor region 132. At 318, in some embodiments, the method 300 includes forming a first portion 512 of the second reacted region 138 from the second semiconductor region 132 and a second portion 514 of the second reacted region 138 from the second semiconductor region 132 during the second period of time. In an embodiment, the second semiconductor region 132 is exposed to oxygen when the mask 350 is removed. According to some embodiments, during the oxidation process, the second semiconductor region 132 reacts with surrounding oxygen such that the second reacted region 138 is formed from the second semiconductor region 132. In an embodiment, the second period of time is between about five to twenty minutes. According to some embodiments, given that the second reacted region 138 is formed from the second semiconductor region 132, at least some of the second reacted region 138 extends at least partially into the second semiconductor region 132. In some embodiments, the second semiconductor region 132 includes silicon germanium (SiGe) while the second reacted region 138 comprises silicon germanium oxide (SiGeOx).

In some embodiments, the second reacted region 138 includes a second dimension 602 comprising a thickness of the second reacted region 138. In an embodiment, the second dimension 602 comprises a distance from an edge 550 of the first portion 512 to an opposing edge 552 of the second portion 514. In some embodiments, the second reacted region 138 comprises rounded shapes, circular shapes, etc., such that the second dimension 602 represents a radial thickness (e.g., radius) of the second reacted region 138.

According to some embodiments, the second dimension 602 causes a second strain 604 in the second fin 112. In some embodiments, the second strain 604 is caused by the second reacted region 138 swelling underneath at least one of the second source 124, the second drain 126, or the second channel 128. In an embodiment, the second strain 604 is compressive in the second fin 112 and, as such, increases electron mobility through the second channel 128.

At 316, the method 300 includes forming a second portion 504 of the first reacted region 136 from the first semiconductor region 130 during the second period of time after the first period of time. In some embodiments, during the second period of time, the first semiconductor region 130 is exposed to oxygen. According to some embodiments, the oxidation process that began by forming the first portion 502 of the first reacted region 136 continues by forming the second portion 504 of the first reacted region 136.

During the second period of time, the oxidation process continues such that the second portion 504 of the first reacted region 136 is formed. In an embodiment, the first portion 502 and second portion 504 extend at least partially into the first semiconductor region 130. In some embodiments, the first reacted region 136 has a first dimension 608 comprising a thickness of the first portion 502 and second portion 504. In an embodiment, the first dimension 608 comprises a distance from an edge 560 of the first portion 502 to an opposing edge 562 of the second portion 504. In some embodiments, the first reacted region 136 comprises a rounded shape, a circular shape, etc., such that the first dimension 608 comprises a radial thickness (e.g., radius) of the first reacted region 136.

According to some embodiments, the first dimension 608 causes a first strain 610 in the first fin 110. In some embodiments, the first strain 610 is caused by the first reacted region 136 swelling underneath at least one of the first source 116, the first drain 118, or the first channel 120. In an embodiment, the first strain 610 is compressive in the first fin 110 and, as such, increases electron mobility through the first channel 120. In some embodiments, the first strain 610 is substantially equal to the second strain 604.

In some embodiments, the first dimension 608 of the first reacted region 136 is substantially equal to the second dimension 602 of the second reacted region 138, such that the first strain 610 and the second strain 604 are substantially equal. In some embodiments, the first dimension 608 is different than the second dimension 602, with the first strain 610 and the second strain 604 nonetheless being substantially equal. In some embodiments, factors such as the size of the first fins 110 and second fins 112, size of the first semiconductor region 130 and second semiconductor region 132, etc. will produce substantially equal strains even though the first dimension 608 is different than the second dimension 602.

Figure 7:
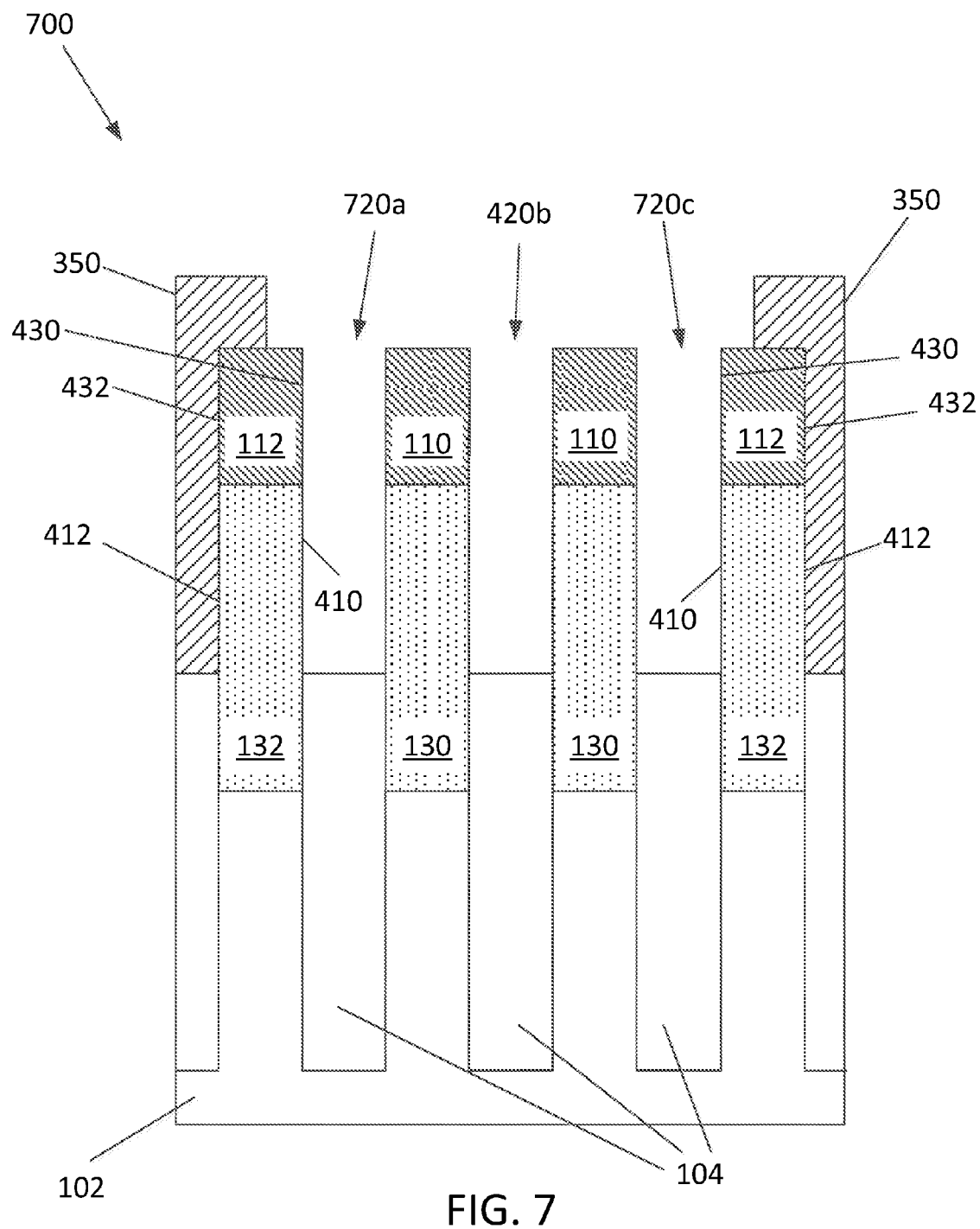
FIG. 7 illustrates masking associated with forming a fin-type field effect transistor, according to an embodiment.

FIG. 7 is a cross-sectional view illustrating a second example fin-type field effect transistor 700. According to some embodiments, the second fin-type field effect transistor 700 includes the substrate 102, STI region 104, first fins 110, second fins 112, first semiconductor regions 130, and second semiconductor regions 132.

In some embodiments, a portion of the mask 350 is removed, such as by etching, to expose portions of the first fins 110, first semiconductor regions 130, second fins 112, and second semiconductor regions 132, and thereby form a first opening 720a, the second opening 420b, and a third opening 720c. In an embodiment, the first opening 720a and third opening 720c are formed such that the first side 410 of the second semiconductor region 132 and the first side 430 of the second fin 112 are exposed.

Figure 8:
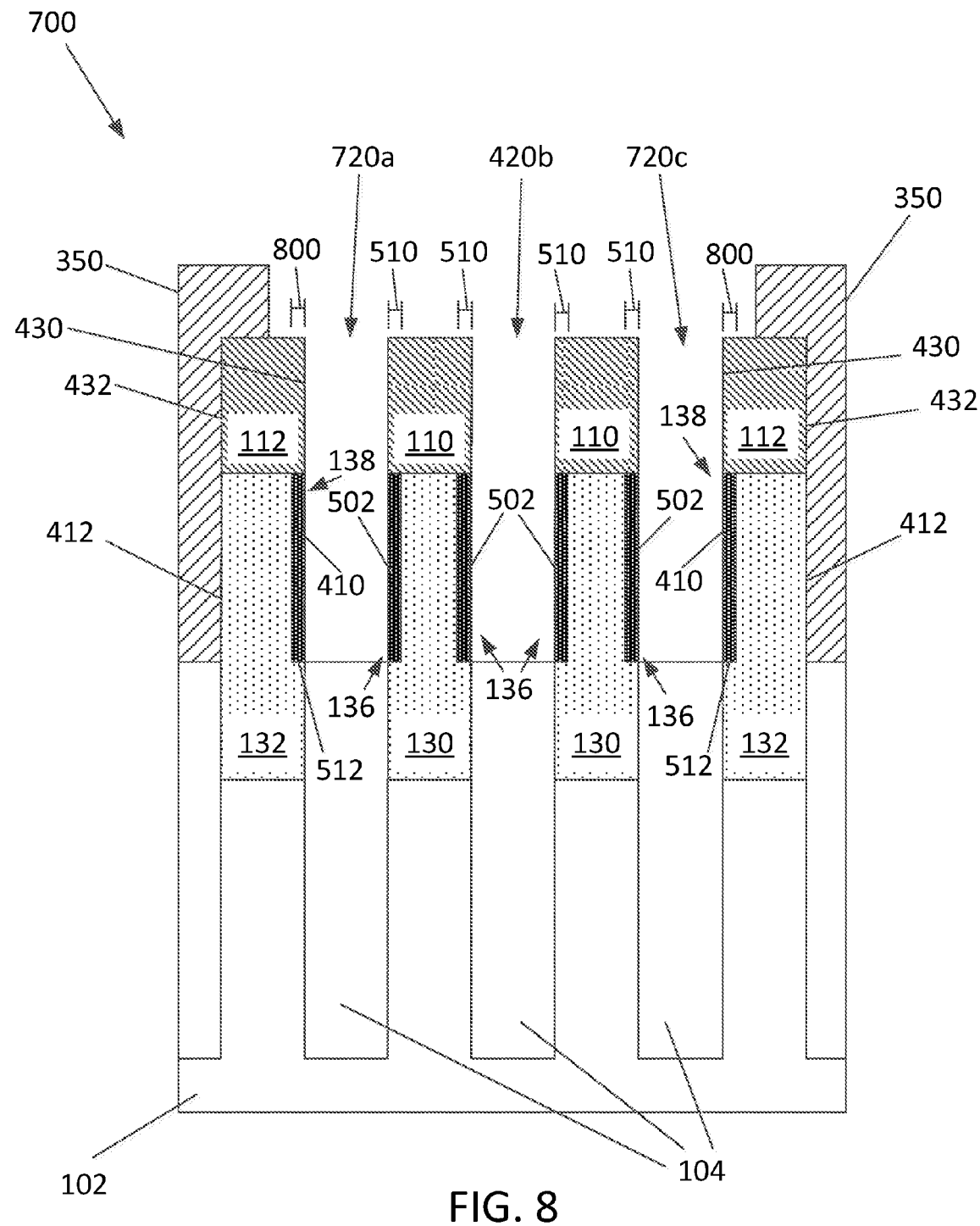
FIG. 8 illustrates forming a reacted region associated with forming a fin-type field effect transistor, according to an embodiment.

Turning to FIG. 8, at 210, the methods 200, 300 include forming the first reacted region 136 from the first semiconductor region 130. At 312, the method 300 includes forming the first portion 502 of the first reacted region 136 from the first semiconductor region 130 during the first period of time. In an embodiment, the first semiconductor regions 130 and the first sides 410 of the second semiconductor regions 132 are exposed to oxygen through the first opening 720a, second opening 420b, and third opening 720c to form the first portion 502 of the first reacted region 136 and the first portion 512 of the second reacted region 138. In an embodiment, the second sides 412 of the second semiconductor regions 132 remain masked by the mask 350 and thus remain substantially unaffected by the oxygen during the first period of time.

According to some embodiments, during the first period of time, the oxidation process occurs at the first semiconductor regions 130. In an embodiment, during the oxidation process, the first reacted region 136, having initial dimension 510, is formed from the first semiconductor region 130. In an embodiment, the first reacted region 136 comprises a first oxidized region formed from the first semiconductor region 130.

According to some embodiments, during the first period of time, the oxidation process occurs at the first sides 410 of the second semiconductor regions 132. In an embodiment, during the oxidation process, the second reacted region 138, having an initial dimension 800, is formed from the second semiconductor region 132. In an embodiment, the second reacted region 138 comprises a second oxidized region formed from the second semiconductor region 132.

Figure 9:
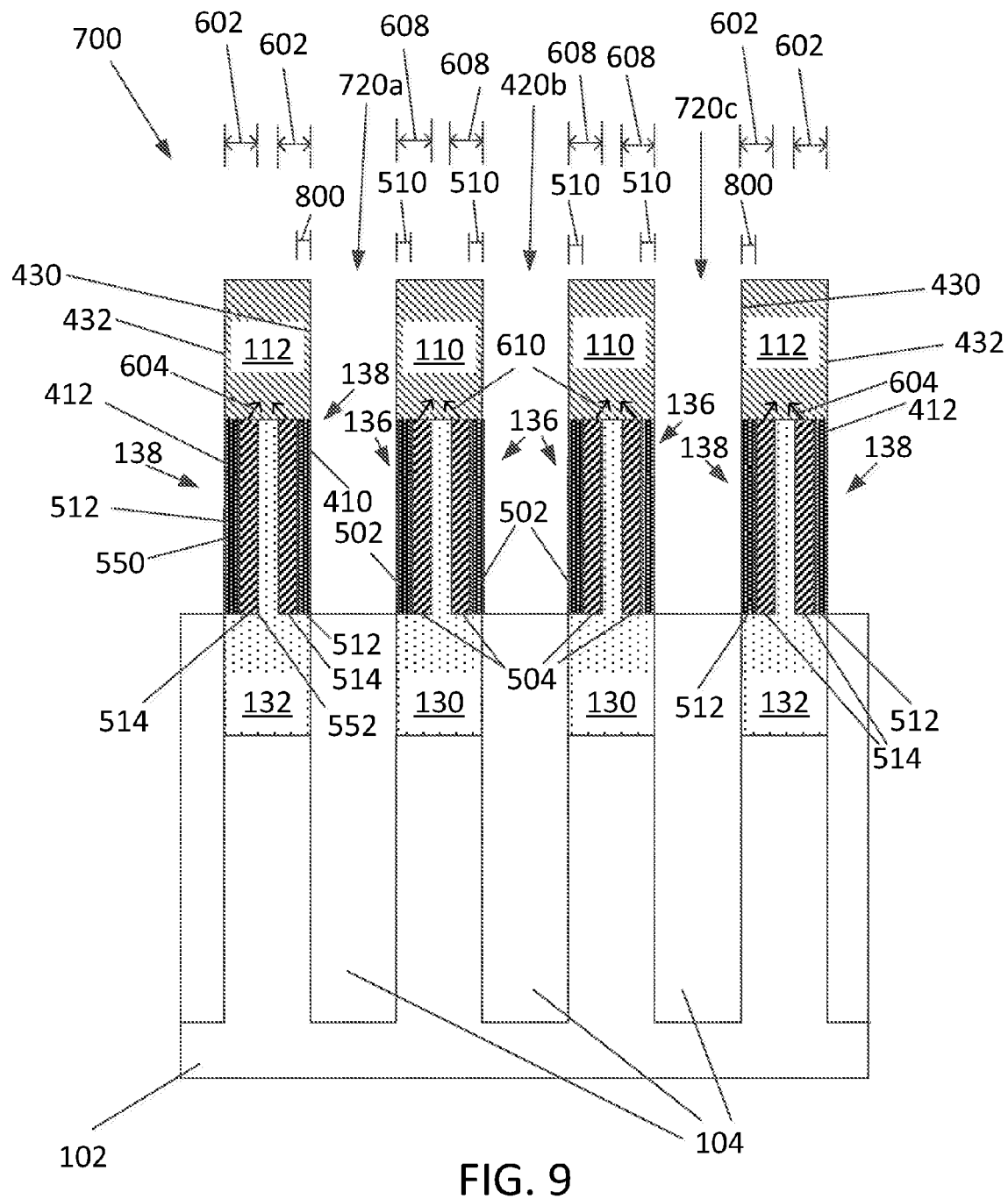
FIG. 9 illustrates forming a reacted region associated with forming a fin-type field effect transistor, according to an embodiment.

Turning to FIG. 9, at 314, the method 300 includes removing the mask 350 after the first period of time. In an embodiment, the mask 350 is removed from the second side 412 of the second semiconductor region 132 and from the second side 432 of the second fins 112 after the first period of time, such as by etching, acid washing, etc. In some embodiments, after the mask 350 is removed from the second side 412 of the second semiconductor region 132, the second side 412 of the second semiconductor region 132 is exposed to oxygen.

At 212, in an embodiment, the method 200 includes forming the second reacted region 138 from the second semiconductor region 132. At 318, in some embodiments, the method 300 includes forming the first portion 512 of the second reacted region 138 from the second semiconductor region 132 and the second portion 514 of the second reacted region 138 from the second semiconductor region 132 during the second period of time. According to some embodiments, given that the first portion 512 of the second reacted region 138 is already formed on the first side 410 of the second semiconductor region 132 during the first period of time, the first portion 512 of the second reacted region 138 is merely formed on the second side 412 of the second semiconductor region 132 during the second period of time. The second portion 514 of the second reacted region 138 is, however, formed on both the first side 410 and the second side 412 of the second semiconductor region 132 during the second period of time. In an embodiment, the second side 412 of the second semiconductor region 132 is exposed to oxygen when the mask 350 is removed. According to some embodiments, during the oxidation process, the second semiconductor region 132 reacts with surrounding oxygen such that the second reacted region 138 is formed from the second semiconductor region 132.

According to some embodiments, given that the second reacted region 138 is formed from the second semiconductor region 132, at least some of the second reacted region 138 extends at least partially into the second semiconductor region 132. In some embodiments, the first portion 512 and second portion 514 extend at least partially into the second semiconductor region 132. In some embodiments, the second dimension 602 comprises a distance from the edge 550 of the first portion 512 to the edge 552 of the second portion 514.

At 316, the method 300 includes forming the second portion 504 of the first reacted region 136 from the first semiconductor region 130 during the second period of time after the first period of time. In an embodiment, the first portion 502 and second portion 504 extend at least partially into the first semiconductor region 130. According to some embodiments, the first reacted region 136 includes the first dimension 608 comprising the thickness of the first portion 502 and the second portion 504.

According to some embodiments, the first dimension 608 causes the first strain 610 in the first fin 110. In some embodiments, the first strain 610 is compressive in the first fin 110 and, as such, increases electron mobility through the first channel 120. According to some embodiments, the second dimension 602 causes the second strain 604 in the second fin 112. In some embodiments, the second strain 604 is compressive in the second fin 112 and, as such, increases electron mobility through the second channel 128. In some embodiments, the first strain 610 is substantially equal to the second strain 604.

According to some embodiments, the first dimension 608 and the second dimension 602 are substantially equal, such that the first strain 610 and the second strain 604 are substantially equal. In some embodiments, the first dimension 608 is different than the second dimension 602, with the first strain 610 and the second strain 604 nonetheless being substantially equal. In some embodiments, factors such as the size of the first fins 110 and second fins 112, size of the first semiconductor region 130 and second semiconductor region 132, etc. will produce substantially equal strains even though the first dimension 608 is different than the second dimension 602.

Figure 10:
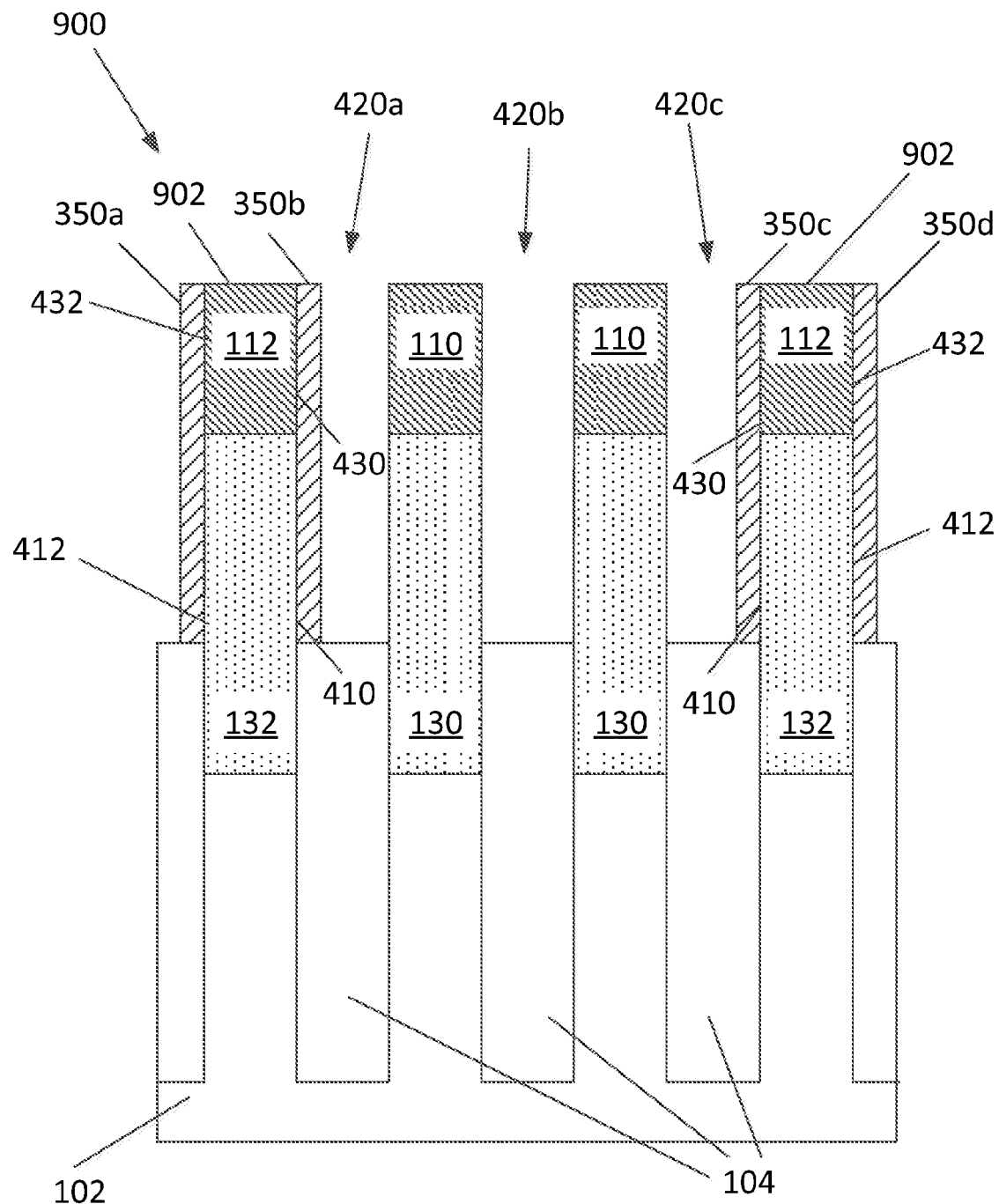
FIG. 10 illustrates masking associated with forming a fin-type field effect transistor, according to an embodiment.

FIG. 10 is a cross-sectional view illustrating a third example fin-type field effect transistor 900. According to some embodiments, the third fin-type field effect transistor 900 includes the substrate 102, STI region 104, first fins 110, second fins 112, first semiconductor regions 130, and second semiconductor regions 132.

In some embodiments, the first opening 420a, second opening 420b, and third opening 420c are formed in the mask 350, such as by etching, acid washing, etc. In some embodiments, the openings 420a, 420b, 420c are formed by removing portions of the mask 350. In an embodiment, after formation of the openings 420a, 420b, 420c, a first mask portion 350a masks the second side 412 of one of the second semiconductor regions 132 and the second side 432 of one of the second fins 112. According to some embodiments, a second mask portion 350b masks the first side 410 of one of the second semiconductor regions 132 and the first side 430 of one of the second fins 112. According to some embodiments, a third mask portion 350c masks the first side 410 of one of the second semiconductor regions 132 and the first side 430 of one of the second fins 112. According to some embodiments, a fourth mask portion 350d masks the second side 412 of one of the second semiconductor regions 132 and the second side 432 of one of the second fins 112. In an embodiment, the openings 420a, 420b, 420c are formed such that upper surfaces 902 of the second fins 112 are exposed.

Figure 11:
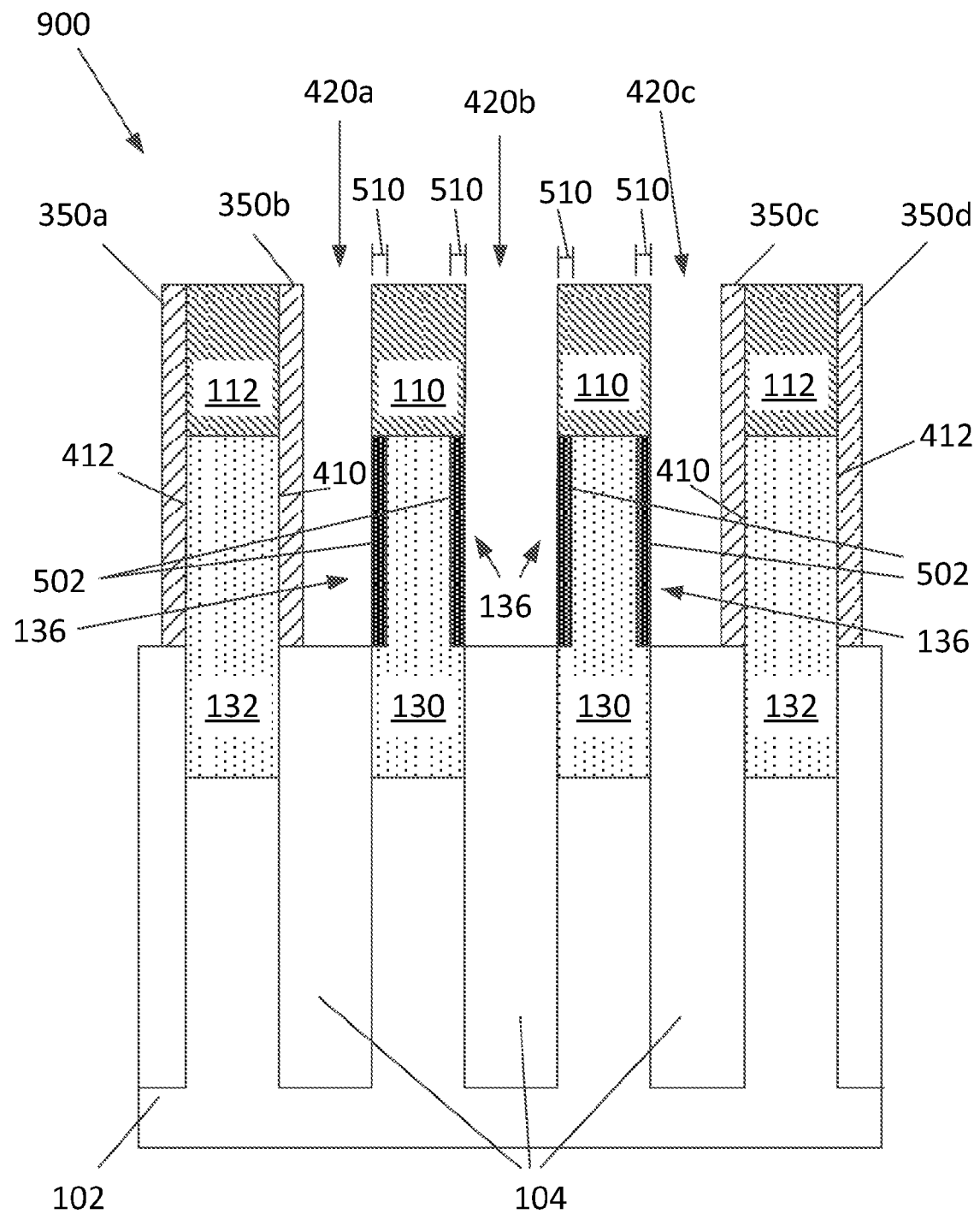
FIG. 11 illustrates forming a reacted region associated with forming a fin-type field effect transistor, according to an embodiment.

Turning to FIG. 11, at 210, the methods 200, 300 include forming the first reacted region 136 from the first semiconductor region 130. At 312, the method 300 includes forming the first portion 502 of the first reacted region 136 from the first semiconductor region during the first period of time. In an embodiment, the first semiconductor regions 130 are exposed to oxygen through the first opening 420a, second opening 420b, and third opening 420c. In some embodiments, the first semiconductor regions 130 are exposed to oxygen for the first period of time, during which the first and second sides 410, 412 of the second semiconductor regions 132 remain masked by the mask portions 350a, 350b, 350c, 350d and thus remain substantially unaffected by the oxygen.

According to some embodiments, during the first period of time, the oxidation process occurs at the first semiconductor regions 130. In an embodiment, the first portion 502 of the first reacted region 136 is formed from the first semiconductor region 130, with the first portion 502 having the initial dimension 510. In some embodiments, the first semiconductor region 130 comprises silicon germanium (SiGe) while the first reacted region 136 comprises silicon germanium oxide (SiGeOx).

Figure 12:
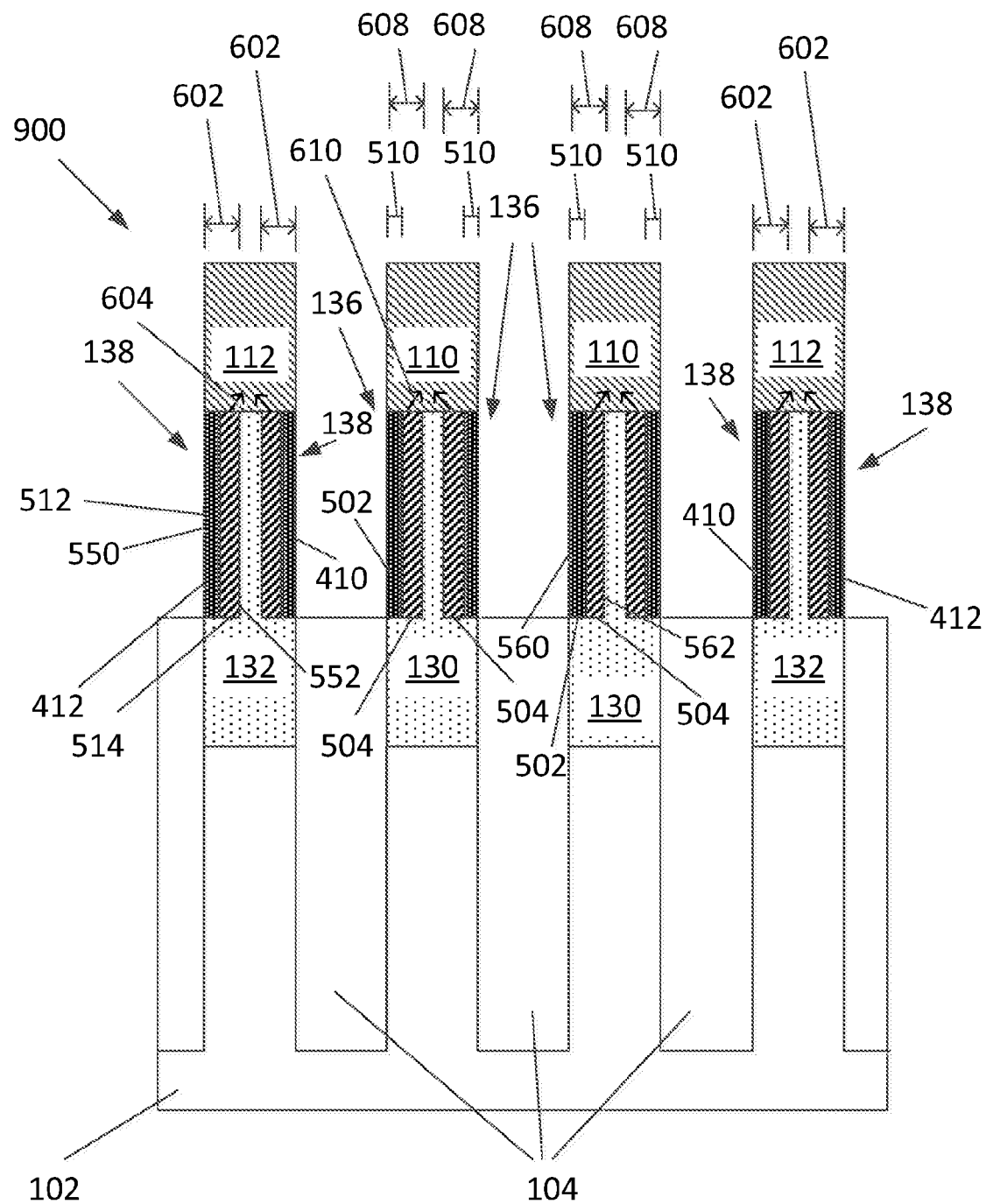
FIG. 12 illustrates forming a reacted region associated with forming a fin-type field effect transistor, according to an embodiment.

Turning to FIG. 12, at 314, the method 300 includes removing the mask 350 after the first period of time. In an embodiment, the mask portions 350a, 350b, 350c, 350d of the mask 350 are removed from the second semiconductor regions 132 and second fins 112 after the first period of time, such as by etching, acid washing, etc.

At 212, in an embodiment, the method 200 includes forming the second reacted region 138 from the second semiconductor region 132. At 318, in some embodiments, the method 300 includes forming the first portion 512 of the second reacted region 138 from the second semiconductor region 132 and the second portion 514 of the second reacted region 138 from the second semiconductor region 132 during the second period of time. According to some embodiments, given that the first portion 512 of the second reacted region 138 is already formed on the first side 410 of the second semiconductor region 132 during the first period of time, the first portion 512 of the second reacted region 138 is merely formed on the second side 412 of the second semiconductor region 132 during the second period of time. The second portion 514 of the second reacted region 138 is, however, formed on both the first side 410 and the second side 412 of the second semiconductor region 132 during the second period of time. In some embodiments, during the oxidation process, the second semiconductor region 132 reacts with surrounding oxygen such that the second reacted region 138 is formed from the second semiconductor region 132.

According to some embodiments, during the second period of time, the first portion 512 and the second portion 514 of the second reacted region 138 are formed by oxidation. In an embodiment, the second semiconductor region 132 includes silicon germanium (SiGe) while the second reacted region 138 comprises silicon germanium oxide (SiGeOx). In some embodiments, the second reacted region 138 includes second dimension 602 comprising a thickness of the second reacted region 138 from the edge 550 of the first portion 512 to the opposing edge 552 of the second portion 514.

At 316, the method 300 includes forming the second portion 504 of the first reacted region 136 from the first semiconductor region 130 during the second period of time after the first period of time. According to some embodiments, the oxidation process that began by forming the first portion 502 of the first reacted region 136 continues by forming the second portion 504 of the first reacted region 136. During the second period of time, the oxidation process continues such that the second portion 504 of the first reacted region 136 is formed. In some embodiments, the first reacted region 136 includes first dimension 608 comprising the thickness of the first portion 502 and second portion 504, which includes a distance from the edge 560 of the first portion 502 to the opposing edge 562 of the second portion 504.

According to some embodiments, the first dimension 608 causes the first strain 610 in the first fin 110. In some embodiments, the second dimension 602 causes the second strain 604 in the second fin 112. In some embodiments, the first dimension 608 and the second dimension 602 are substantially equal, such that the first strain 610 and the second strain 604 are substantially equal.

In an embodiment, a fin-type field effect transistor comprises a first fin comprising a first drain, a first source, and a first channel. In an embodiment, the fin-type field effect transistor comprises a second fin comprising a second drain, a second source, and a second channel. In an embodiment, the fin-type field effect transistor comprises a first semiconductor region under the first fin. In an embodiment, the fin-type field effect transistor comprises a second semiconductor region under the second fin. In an embodiment, the fin-type field effect transistor comprises a first reacted region adjacent the first semiconductor region. In an embodiment, the fin-type field effect transistor comprises a second reacted region adjacent the second semiconductor region, the first reacted region having a first dimension configured to cause a first strain in the first channel, and the second reacted region having a second dimension configured to cause a second strain in the second channel, the first strain substantially equal to the second strain.

In an embodiment, a method for fabricating a fin-type field effect transistor comprises forming a first semiconductor region. In an embodiment, the method comprises forming a second semiconductor region. In an embodiment, the method comprises forming a first fin over the first semiconductor region, the first fin comprising a first source, a first drain, and a first channel. In an embodiment, the method comprises forming a second fin over the second semiconductor region, the second fin comprising a second source, a second drain, and a second channel. In an embodiment, the method comprises forming a first reacted region from the first semiconductor region. In an embodiment, the method comprises forming a second reacted region from the second semiconductor region, the first reacted region having a first dimension causing a first strain in the first channel, and the second reacted region having a second dimension causing a second strain in the second channel, the first strain substantially equal to the second strain.

In an embodiment, a method for fabricating a fin-type field effect transistor comprises forming a first semiconductor region. In an embodiment, the method comprises forming a second semiconductor region. In an embodiment, the method comprises forming a first fin over the first semiconductor region, the first fin comprising a first source, a first drain, and a first channel. In an embodiment, the method comprises forming a second fin over the second semiconductor region, the second fin comprising a second source, a second drain, and a second channel. In an embodiment, the method comprises masking the second semiconductor region for a first period of time. In an embodiment, the method comprises forming a first portion of a first reacted region from the first semiconductor region during the first period of time. In an embodiment, the method comprises removing the mask after the first period of time. In an embodiment, the method comprises forming a second portion of the first reacted region from the first semiconductor region during a second period of time after the first period of time. In an embodiment, the method comprises forming a first portion of a second reacted region from the second semiconductor region and a second portion of the second reacted region from the second semiconductor region during the second period of time, the first reacted region having a first dimension causing a first strain in the first channel, and the second reacted region having a second dimension causing a second strain in the second channel, the first strain substantially equal to the second strain.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first fin and a second fin generally corresponds to fin A and fin B or two different or two identical fins or the same fin.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of fabricating a fin-type field effect transistor comprising:
    forming a first semiconductor region;
    forming a second semiconductor region;
    forming a first fin over the first semiconductor region, the first fin comprising a first source, a first drain, and a first channel;
    forming a second fin over the second semiconductor region, the second fin comprising a second source, a second drain, and a second channel;
    masking a portion of the second semiconductor region for a first period of time;
    forming a first portion of a first reacted region from the first semiconductor region during the first period of time;
    removing the mask after the first period of time; and
    forming a second portion of the first reacted region and a second reacted region from the portion of the second semiconductor region during a second period of time after the first period of time, the first reacted region having a first dimension causing a first strain in the first channel, and the second reacted region having a second dimension causing a second strain in the second channel, the first strain substantially equal to the second strain.

2. The method of claim 1, wherein the forming a second reacted region comprises forming a first portion of the second reacted region and a second portion of the second reacted region during the second period of time.

3. The method of claim 1, wherein the forming a first portion of a first reacted region comprises forming a first oxidized region from the first semiconductor region.

4. The method of claim 1, wherein the first semiconductor region comprises silicon germanium (SiGe) and the first reacted region comprises silicon germanium oxide (SiGeOx).

5. The method of claim 1, wherein the forming a second reacted region comprises forming a second oxidized region from the portion of the second semiconductor region.

6. The method of claim 1, wherein the second semiconductor region comprises silicon germanium (SiGe) and the second reacted region comprises silicon germanium oxide (SiGeOx).

7. A method of fabricating a fin-type field effect transistor comprising:
    forming a first semiconductor region;
    forming a second semiconductor region;
    forming a first fin over the first semiconductor region, the first fin comprising a first source, a first drain, and a first channel;
    forming a second fin over the second semiconductor region, the second fin comprising a second source, a second drain, and a second channel;
    masking the second semiconductor region for a first period of time;
    forming a first portion of a first reacted region from the first semiconductor region during the first period of time;
    removing the mask after the first period of time;
    forming a second portion of the first reacted region from the first semiconductor region during a second period of time after the first period of time; and
    forming a first portion of a second reacted region from the second semiconductor region and a second portion of the second reacted region from the second semiconductor region during the second period of time, the first reacted region having a first dimension causing a first strain in the first channel, and the second reacted region having a second dimension causing a second strain in the second channel, the first strain substantially equal to the second strain.

8. The method of claim 7, comprising exposing at least one of the first semiconductor region or the second semiconductor region to oxygen to form at least one of the first reacted region or the second reacted region.

9. The method of claim 7, wherein the masking comprises masking at least one of a first side or a second side of the second semiconductor region.

10. The method of claim 9, wherein the removing comprises removing the mask from the first side and the second side of the second semiconductor region.

11. A method of fabricating a fin-type field effect transistor comprising:
    forming a first semiconductor region;
    forming a second semiconductor region;
    forming a first fin over the first semiconductor region, the first fin defining a first channel;
    forming a second fin over the second semiconductor region, the second fin defining a second channel;
    masking at least one side of the second semiconductor region;
    exposing the first semiconductor region to oxygen while the at least one side of the second semiconductor region is masked to form a first portion of a first reacted region from the first semiconductor region;
    removing the mask from the at least one side of the second semiconductor region; and
    exposing the at least one side of the second semiconductor region to oxygen while further exposing the first semiconductor region to oxygen to form a second portion of the first reacted region from the first semiconductor region and to form a second reacted region from the second semiconductor region, wherein:
        the second semiconductor region oxidizes at a faster rate than the first semiconductor region during the exposing the at least one side of the second semiconductor region to oxygen while further exposing the first semiconductor region to oxygen, and
        the exposing the at least one side of the second semiconductor region to oxygen while further exposing the first semiconductor region to oxygen comprises:
            exposing the at least one side of the second semiconductor region to oxygen while further exposing the first semiconductor region to oxygen until a width of the second reacted region is substantially equal to a width of the first reacted region.

12. The method of claim 11, wherein the masking comprises masking at least two sides of the second semiconductor region.

13. The method of claim 11, wherein the masking comprises masking a top surface of the second fin.

14. The method of claim 11, wherein the exposing the first semiconductor region to oxygen comprises inducing swelling in the first semiconductor region.

15. The method of claim 14, wherein the swelling creates a compressive strain in the first channel of the first fin.

16. The method of claim 11, wherein the exposing the at least one side of the second semiconductor region to oxygen comprises inducing swelling in the second semiconductor region.

17. The method of claim 16, wherein the swelling creates a compressive strain in the second channel of the second fin.

18. The method of claim 11, wherein the first semiconductor region comprises silicon germanium (SiGe) and the first reacted region comprises silicon germanium oxide (SiGeOx).

19. The method of claim 18, wherein the second semiconductor region comprises silicon germanium (SiGe) and the second reacted region comprises silicon germanium oxide (SiGeOx).

20. The method of claim 11, wherein the second semiconductor region is substantially cylindrical and the masking the second semiconductor region comprises forming the mask around a circumference of the second semiconductor region.

\* \* \* \* \*